US006542409B2

(12) United States Patent
Yamada

(10) Patent No.: US 6,542,409 B2
(45) Date of Patent: Apr. 1, 2003

(54) SYSTEM FOR REFERENCE CURRENT TRACKING IN A SEMICONDUCTOR DEVICE

(75) Inventor: Shigekazu Yamada, Cupertino, CA (US)

(73) Assignee: Fujitsu Limited (JP)

( * ) Notice: Subject to any disclaimer, the term of this patent is extended or adjusted under 35 U.S.C. 154(b) by 0 days.

(21) Appl. No.: 09/910,321

(22) Filed: Jul. 19, 2001

(65) Prior Publication Data

US 2003/0016556 A1 Jan. 23, 2003

(51) Int. Cl.[7] .............................................. G11C 16/06
(52) U.S. Cl. .............................. 365/185.2; 365/185.18; 365/189.07; 365/189.09; 327/55; 327/77; 327/307; 327/362
(58) Field of Search ........................ 365/185.18, 189.09, 365/185.2, 185.33, 189.07, 72; 327/55, 77, 307, 362

(56) References Cited

U.S. PATENT DOCUMENTS

| 5,508,958 A | * | 4/1996 | Fazio et al. .................. 365/168 |
| 5,638,322 A | * | 6/1997 | Lacey ....................... 365/185.2 |
| 5,717,640 A | * | 2/1998 | Hashimoto ................ 365/185.2 |
| 5,801,533 A | * | 9/1998 | Kalb, Jr. ...................... 324/251 |
| 6,255,897 B1 | * | 7/2001 | Klemmer .................... 323/315 |

* cited by examiner

*Primary Examiner*—Michael S. Lebentritt
*Assistant Examiner*—Toan Le
(74) *Attorney, Agent, or Firm*—Coudert Brothers LLP

(57) ABSTRACT

System for generating a reference current in a semiconductor device. The reference current is compared to an internal device current generated by an internal device circuit to verify operation of the device. The system includes a current generator that generates the reference current and is located within the semiconductor device, and a bias generator that is coupled to the internal device circuit. The bias generator generates a back bias current to offset variations to the reference current.

15 Claims, 2 Drawing Sheets

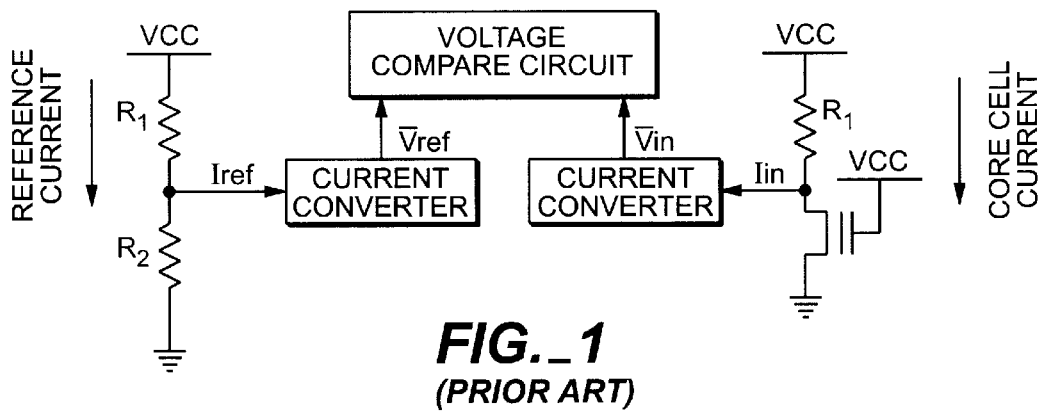
FIG._1
*(PRIOR ART)*
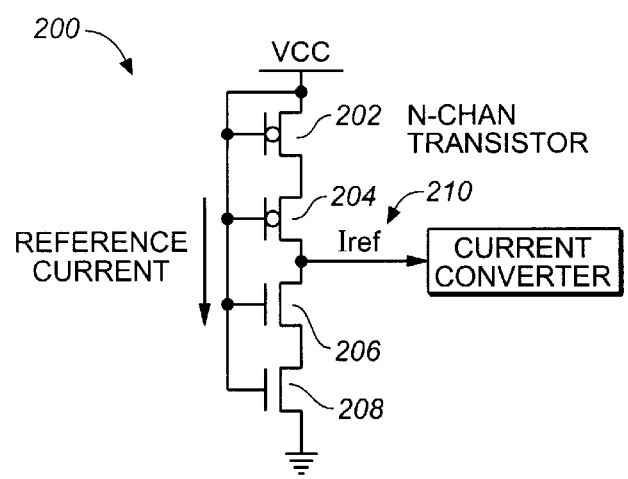
FIG._2

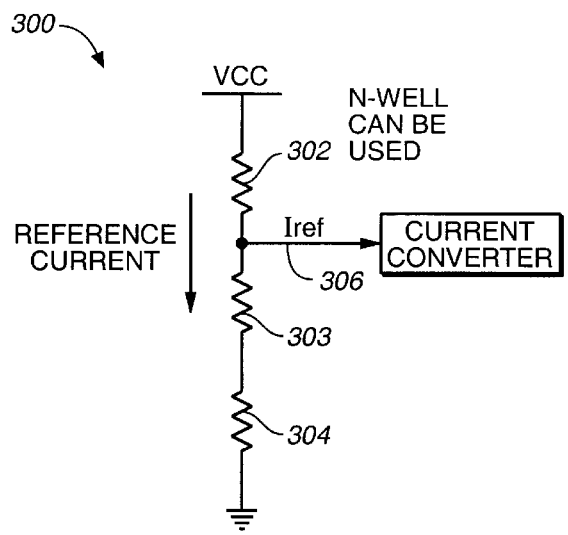
FIG._3
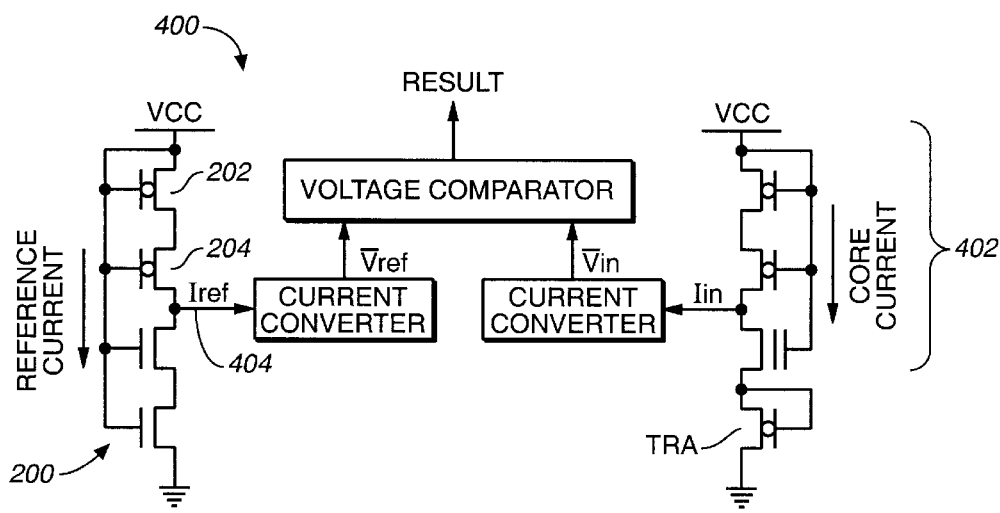
FIG._4

US 6,542,409 B2

SYSTEM FOR REFERENCE CURRENT TRACKING IN A SEMICONDUCTOR DEVICE

FIELD OF THE INVENTION

The present invention relates generally to memory devices, and more particularly, to a system for reference current tracking in a memory device.

BACKGROUND OF THE INVENTION

In semiconductor devices, such as present FLASH memory devices, there are many instances where the current flowing through a core cell is compared to a reference current. For example, to set a core cell threshold (Vth) voltage. In this case, after the device has been programmed or erased, it is desirable to verify whether or not the program or erase functions were successful. One way to do this is to compare the core cell current to a reference current.

FIG. 1 shows a diagram of a typical circuit used to set a core cell Vth in a memory device. When the core cell current becomes equivalent to a reference current, the function (program or erase) has been successfully performed.

The reference current is required to be constant regardless of device process variations. One way to achieve this is to use a power supply external to the device. For example, an external device tester can include a power supply that provides a constant reference current. However, using an external tester device is time consuming and inefficient.

Another way to generate a constant reference current is to do it internal to the device as shown in FIG. 1. However, the internal circuit shown in FIG. 1 is also subject to process variations, and so may not provide a constant reference current. For example, if the reference current goes lower or higher, due to process variations, the core cell Vth will be set higher or lower than desired.

Therefore, it would be desirable to have a way to generate a constant reference current that does not require an external test device and does not suffer from internal process variations.

SUMMARY OF THE INVENTION

The present invention includes a system for reference current tracking in a semiconductor device. The system includes a circuit to internally generate a reference current that can be compared to a core cell current to verify device functions. The system also includes a back bias circuit that reduces the effects of process variations.

As a result, the system is operable to provide an effective constant reference current that does not require an external power source and that can be constructed from a small circuit that does not use excessive amounts of device real estate.

In one embodiment of the invention, apparatus for generating a reference current in a semiconductor device is provided. The reference current is compared to an internal device current generated by an internal device circuit to verify operation of the device. The apparatus comprises a current generator that is located within the semiconductor device and generates the reference current, and a bias generator that is coupled to the internal device circuit, wherein the bias generator generates a back bias current to offset variations to the reference current.

In another embodiment of the invention, a method for generating a reference current in a semiconductor device is provided. The reference current is compared to an internal device current generated by an internal device circuit to verify operation of the device. The method comprises steps of generating the reference current within the semiconductor device, and generating a back bias current that is coupled to the internal device circuit, wherein the back bias current offsets variations to the reference current.

BRIEF DESCRIPTION OF THE DRAWINGS

The forgoing aspects and the attendant advantages of this invention will become more readily apparent by reference to the following detailed description when taken in conjunction with the accompanying drawings wherein:

FIG. 1 shows a diagram of a typical circuit used to set a core cell Vth in a memory device;

FIG. 2 shows a constant current reference circuit for use in one embodiment of the present invention;

FIG. 3 shows a constant current reference circuit for use in one embodiment of the present invention; and FIG. 4 shows one embodiment of a circuit for providing a constant current reference constructed in accordance with the present invention.

DETAILED DESCRIPTION OF THE INVENTION

The present invention includes a system for reference current tracking in a semiconductor device. One or more embodiments included in the present invention will now be described in detail in the following text and accompanying drawings.

FIG. 2 shows a constant current reference circuit 200 for use in one embodiment of the present invention. The circuit 200 generates a constant reference current (Iref) that can be used to compare to a core cell current for the purpose of setting Vth.

The circuit 200 includes N-channel transistors 202, 204 and P-channel transistors 206 and 208. The transistors, which can be very small, are coupled between a power terminal (Vcc) and a ground terminal to produce the constant reference current (Iref), as shown at 210. However, the constant reference current 210 may have some variations since the mobility and Vth vary across process corners.

FIG. 3 shows a constant current reference circuit 300 for use in one embodiment of the present invention. The circuit 300 generates a constant reference current (Iref) that can be used to compare to a core cell current for the purpose of setting Vth.

The circuit 300 includes resistive elements 302, 304 and 306 that are constructed using N-well technology. The elements are coupled between a power terminal (Vcc) and a ground terminal to produce a constant current at shown at 306. The ratio of the resistive elements does not vary across process corners, so the resulting constant reference current is very stable. However, the N-well construction uses large amounts of space on the device, and so would not be suitable for applications where space is limit.

FIG. 4 shows a circuit 400 for providing a constant reference current constructed in accordance with one embodiment of the present invention. The circuit 400 includes the constant reference circuit 200 and further includes transistor TRA that is coupled to the core current circuit 402. The transistor TRA compensates for inaccuracies of reference current produced by the circuit 200.

The addition of transistor TRA to the source of the core cell results in the core cell experiencing a back bias, which adjusts the core cell current. The back bias is dependent on the voltage threshold (Vth) of the transistor TRA. In other words, the back bias is dependent on the process variations.

During operations of the circuit 400, when a high Vth process corner exists, the reference current 404 becomes small and the core cell current becomes small as well, due to the effects of the strong back bias to the core cell provided by the transistor TRA. The back bias cancels out the reference current variation caused by the process variation. Since the transistor TRA is the same type transistor as the transistors 202 and 204, the strength of the back bias tracks with the reference current.

The circuit 400 effectively reduces the effect of process variation on the reference current. At the same time, the circuit 400 is very small so that valuable device real estate is efficiently used. Since one or more embodiments of the invention effectively eliminate the impact of process variation on the reference current generation, it is possible to embed on the device test modes and functionality that were previously provided by an external test device. As a result, reduced costs and greater efficiency is achieved and overall test times may be reduced as well.

The present invention includes a system for reference current tracking in a semiconductor device. The embodiments described above are illustrative of the present invention and are not intended to limit the scope of the invention to the particular embodiments described. Accordingly, while several embodiments of the invention have been illustrated and described, it will be appreciated that various changes can be made therein without departing from the spirit or essential characteristics thereof. Accordingly, the disclosures and descriptions herein are intended to be illustrative, but not limiting, of the scope of the invention which is set forth in the following claims.

What is claimed is:

1. Apparatus for generating a reference current in a semiconductor device, wherein the reference current is compared to a core cell current generated by a core cell to verify operation of the device, the apparatus comprising:

a current generator that is located within the semiconductor device and generates the reference current; and a bias generator that is coupled between the core cell and a ground terminal, wherein the bias generator generates a back bias current to offset variations to the reference current.

2. The apparatus of claim 1, wherein the variations to the reference current are process variations.

3. The apparatus of claim 2, wherein the back bias current compensates for the process variations that effect the reference current.

4. The apparatus of claim 1, wherein the current generator comprises at least one reference transistor.

5. The apparatus of claim 4, wherein the bias generator comprises at least one bias transistor that is the same type as the at least one reference transistor.

6. The apparatus of claim 1, wherein the semiconductor device is a memory device.

7. The apparatus of claim 6, wherein the current generator comprises at least one reference transistor.

8. The apparatus of claim 7, wherein the bias generator comprises at least one bias transistor that is the same type as the at least one reference transistor.

9. The apparatus of claim 6, wherein the current generator comprises at least one N-channel transistor.

10. The apparatus of claim 9, wherein the bias generator comprises at least one bias transistor that is the same type as the at least one reference transistor, wherein the at least one bias transistor produces the back bias current, and wherein the back bias current is coupled to the core cell current.

11. A method for generating a reference current in a semiconductor device, wherein the reference current is compared to a core cell current generated by a core cell to verify operation of the device, the method comprising steps of:

generating the reference current within the semiconductor device; and generating a back bias current that is coupled between the core cell and a ground terminal, wherein the back bias current offsets variations to the reference current.

12. The method of claim 11, wherein the step of generating the reference current is a step of generating the reference current with at least one reference transistor.

13. The method of claim 12, wherein the step of generating a back bias current is a step of generating a back bias current with at least one bias transistor that is the same type as the at least one reference transistor.

14. The method of claim 11, wherein the semiconductor device is a memory device, and wherein the step of generating the reference current is a step of generating the reference current with at least one N-channel transistor.

15. The method of claim 14, wherein the step of generating the back bias current is a step of generating the back bias current with at least one bias transistor that is the same type as the at least one reference transistor.

* * * * *